United States Patent
Yota et al.

(10) Patent No.: US 11,101,160 B2
(45) Date of Patent: Aug. 24, 2021

(54) DEVICE PACKAGING USING A RECYCLABLE CARRIER SUBSTRATE

(71) Applicant: SKYWORKS SOLUTIONS, INC., Irvine, CA (US)

(72) Inventors: Jiro Yota, Westlake Village, CA (US); Hong Shen, Palo Alto, CA (US); Viswanathan Ramanathan, Thousand Oaks, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/845,455

(22) Filed: Apr. 10, 2020

(65) Prior Publication Data

US 2020/0243369 A1 Jul. 30, 2020

Related U.S. Application Data

(62) Division of application No. 15/429,416, filed on Feb. 10, 2017, now Pat. No. 10,629,468.

(Continued)

(51) Int. Cl.
*H01L 21/768* (2006.01)
*H01L 23/522* (2006.01)
(Continued)

(52) U.S. Cl.
CPC .... *H01L 21/6835* (2013.01); *H01L 21/76802* (2013.01); *H01L 23/13* (2013.01); *H01L 23/5226* (2013.01); *H01L 23/585* (2013.01); *H03H 3/0072* (2013.01); *H03H 3/02* (2013.01); *H03H 3/08* (2013.01); *H03H 9/1014* (2013.01);

(Continued)

(58) Field of Classification Search
None
See application file for complete search history.

(56) References Cited

U.S. PATENT DOCUMENTS 5,561,085 A 10/1996 Gorowitz et al.
5,668,033 A 9/1997 Ohara et al.
(Continued)

OTHER PUBLICATIONS

Chao et al., "Microcap Selective Packaging through Flip Chip Alignment", NSTI—Nanotech 2004, vol. 3, 2004, pp. 472-475.
(Continued)

*Primary Examiner* — Xiaoming Liu
(74) *Attorney, Agent, or Firm* — Lando & Anastasi, LLP

(57) ABSTRACT

According to various aspects and embodiments, a method for forming a packaged electronic device is provided. In accordance with one embodiment, the method comprises depositing a layer of temporary adhesive material on at least a portion of a surface of a first substrate having a coefficient of thermal expansion, depositing a layer of dielectric material on at least a portion of the layer of temporary adhesive material, forming at least one seal ring on at least a portion of the layer of dielectric material, providing a second substrate having a coefficient of thermal expansion that is substantially the same as the coefficient of thermal expansion of the first substrate, the second substrate having at least one bonding structure attached to a surface of the second substrate, and aligning the at least one seal ring to the at least one bonding structure and bonding the first substrate to the second substrate.

21 Claims, 11 Drawing Sheets

Related U.S. Application Data

(60) Provisional application No. 62/293,987, filed on Feb. 11, 2016.

(51) Int. Cl.

| | | |
|---|---|---|
| *H01L 23/498* | (2006.01) | |
| *H01L 21/683* | (2006.01) | |
| *H01L 23/58* | (2006.01) | |
| *H03H 9/10* | (2006.01) | |
| *H01L 23/13* | (2006.01) | |
| *H03H 3/007* | (2006.01) | |
| *H03H 3/02* | (2006.01) | |
| *H03H 3/08* | (2006.01) | |
| *H01L 41/187* | (2006.01) | |
| *H01L 41/053* | (2006.01) | |
| *H01L 41/25* | (2013.01) | |

(52) U.S. Cl.
CPC ........ *H03H 9/1057* (2013.01); *H03H 9/1071* (2013.01); *H01L 21/6836* (2013.01); *H01L 23/49816* (2013.01); *H01L 23/49827* (2013.01); *H01L 41/053* (2013.01); *H01L 41/1873* (2013.01); *H01L 41/25* (2013.01); *H01L 2221/68327* (2013.01); *H01L 2221/68345* (2013.01); *H01L 2221/68381* (2013.01); *H01L 2224/11* (2013.01)

(56) References Cited

U.S. PATENT DOCUMENTS

| | | | |
|---|---|---|---|
| 5,773,198 A | 6/1998 | Swirbel et al. | |
| 6,444,111 B1 | 9/2002 | Montgomery | |
| 6,635,412 B2 | 10/2003 | Afromowitz | |
| 6,777,267 B2 | 8/2004 | Ruby et al. | |
| 7,598,118 B2 | 10/2009 | Sugiura et al. | |
| 7,635,636 B2 | 12/2009 | McClure et al. | |
| 7,875,230 B2 | 1/2011 | Silverbrook | |
| 7,892,962 B2 | 2/2011 | Su | |
| 7,955,885 B1 | 6/2011 | Bhugra et al. | |
| 8,367,477 B2 | 2/2013 | Chien et al. | |
| 8,617,927 B1 | 12/2013 | Margomenos et al. | |
| 2002/0102477 A1 | 8/2002 | Tanaka et al. | |
| 2003/0020061 A1 | 1/2003 | Emerson et al. | |
| 2004/0213955 A1 | 10/2004 | Boyle et al. | |
| 2005/0146397 A1* | 7/2005 | Koga | H03H 9/1085 333/133 |
| 2005/0189621 A1 | 9/2005 | Cheung | |
| 2006/0006511 A1 | 1/2006 | Roh et al. | |
| 2006/0214292 A1* | 9/2006 | Agraharam | H01L 24/13 257/737 |
| 2006/0220173 A1* | 10/2006 | Gan | H01L 21/4857 257/528 |
| 2007/0020807 A1 | 1/2007 | Geefay et al. | |
| 2007/0042527 A1 | 2/2007 | Tuckerman et al. | |
| 2007/0176250 A1 | 8/2007 | Lee et al. | |
| 2007/0243662 A1 | 10/2007 | Johnson et al. | |
| 2007/0279152 A1 | 12/2007 | Kawamura | |
| 2008/0038874 A1 | 2/2008 | Lin | |
| 2008/0067664 A1 | 3/2008 | Lim et al. | |
| 2008/0283198 A1 | 11/2008 | Papworth et al. | |
| 2008/0299288 A1 | 12/2008 | Kobrin et al. | |
| 2009/0121303 A1 | 5/2009 | Chen et al. | |
| 2010/0116527 A1 | 5/2010 | Khosla et al. | |
| 2010/0230795 A1 | 9/2010 | Kriman et al. | |
| 2010/0230803 A1* | 9/2010 | Chien | H01L 24/19 257/693 |
| 2010/0270919 A1 | 10/2010 | Hubert et al. | |
| 2011/0115036 A1 | 5/2011 | Moon et al. | |
| 2011/0210413 A1* | 9/2011 | Huang | H01L 27/14618 257/433 |
| 2011/0234055 A1 | 9/2011 | Fukano et al. | |
| 2012/0094418 A1 | 4/2012 | Grama et al. | |
| 2013/0061756 A1 | 3/2013 | Hung et al. | |
| 2013/0062995 A1* | 3/2013 | Matsuda | H03H 9/1071 310/313 R |
| 2013/0069241 A1 | 3/2013 | Lin et al. | |
| 2013/0082376 A1 | 4/2013 | Nagarkar et al. | |
| 2013/0147036 A1 | 6/2013 | Choi et al. | |
| 2013/0200528 A1 | 8/2013 | Lin et al. | |
| 2013/0241038 A1 | 9/2013 | Parikh et al. | |
| 2013/0249095 A1 | 9/2013 | Shen | |
| 2013/0249109 A1* | 9/2013 | Ma | H01L 23/481 257/774 |
| 2013/0306943 A1 | 11/2013 | Kato et al. | |
| 2013/0330878 A1 | 12/2013 | Ararao | |
| 2014/0015122 A1 | 1/2014 | Chou et al. | |
| 2014/0015373 A1 | 1/2014 | Kanae | |
| 2014/0191617 A1 | 7/2014 | Ohashi et al. | |
| 2014/0264230 A1 | 9/2014 | Borodulin et al. | |
| 2014/0319522 A1 | 10/2014 | Daubenspeck et al. | |
| 2014/0327131 A1 | 11/2014 | Yeh et al. | |
| 2015/0014820 A1 | 1/2015 | Owada | |
| 2015/0188024 A1 | 7/2015 | Ishigami et al. | |
| 2015/0210537 A1 | 7/2015 | Chang et al. | |
| 2015/0266726 A1* | 9/2015 | Gudeman | B81C 1/00269 438/121 |
| 2015/0277099 A1 | 10/2015 | Hong et al. | |
| 2015/0357302 A1 | 12/2015 | Chen et al. | |
| 2016/0037649 A1 | 2/2016 | Barber | |
| 2017/0086320 A1 | 3/2017 | Barber | |
| 2017/0178992 A1 | 6/2017 | Jeong et al. | |
| 2017/0236742 A1 | 8/2017 | Yota et al. | |
| 2017/0243739 A1 | 8/2017 | Barber et al. | |
| 2017/0271270 A1 | 9/2017 | Dias et al. | |
| 2017/0345676 A1 | 11/2017 | Cheng | |
| 2017/0365554 A1 | 12/2017 | Barber et al. | |
| 2018/0047650 A1 | 2/2018 | Barber et al. | |
| 2020/0013689 A1 | 1/2020 | Barber et al. | |

OTHER PUBLICATIONS

International Search Report and Written Opinion from corresponding International Application No. PCT/US2017/017323 dated Jun. 7, 2017.

Kim, Y.K. et al., "A Novel Low-Temperature Microcap Packaging using SU-8 Bonding," Solid-State Sensors, Actuators and Microsystems Conference, Jun. 10-14, 2007.

Steigert et al., "A versatile and flexible low-temperature full-wafer bonding process of monolithic 3D microfluidic structures in SU-8", Journal of Micromechanics and Microengineering, 18 (2008), 095013, pp. 1-8.

* cited by examiner

DEVICE PACKAGING USING A RECYCLABLE CARRIER SUBSTRATE

CROSS-REFERENCE TO RELATED APPLICATIONS

This application claims priority under 35 U.S.C. § 121 as a Division of U.S. application Ser. No. 15/429,416, titled "DEVICE PACKAGING USING A RECYCLABLE CARRIER SUBSTRATE," filed Feb. 10, 2017, which in turn claims priority under 35 U.S.C. § 119(e) to U.S. Provisional Application No. 62/293,987 filed on Feb. 11, 2016. Each of these applications is incorporated herein by reference in its entirety for all purposes.

BACKGROUND

Field of Invention

The present disclosure relates generally to the field of semiconductor wafer processing technology. In particular, aspects and embodiments of the present invention relate to a recyclable carrier substrate that can be used in packages for electronic devices, such as semiconductor devices.

Discussion of Related Art

Many types of electronic devices incorporate the use of thin and/or fragile materials, or are designed to have features that themselves are fragile and susceptible to damage during processing. For example, some forms of MEMS devices or acoustic wave devices, such as surface acoustic wafer (SAW) filters or bulk acoustic wave (BAW) filters, are formed on piezoelectric substrates, such as lithium tantalate ($LiTaO_3$). These substrates are fragile, making them difficult to handle during wafer processing.

SUMMARY

According to one aspect of the present invention, a method of forming a packaged electronic device is provided. In one embodiment, the method comprises depositing a layer of temporary adhesive material on at least a portion of a surface of a first substrate having a coefficient of thermal expansion, depositing a layer of dielectric material on at least a portion of the layer of temporary adhesive material, forming at least one seal ring on at least a portion of the layer of dielectric material, providing a second substrate having a coefficient of thermal expansion that is substantially the same as the coefficient of thermal expansion of the first substrate, the second substrate having at least one bonding structure attached to a surface of the second substrate, and aligning the at least one seal ring to the at least one bonding structure and bonding the first substrate to the second substrate.

In some embodiments, the method further comprises thinning the second substrate. According to a further embodiment, the second substrate has a thickness in a range of about 150 to 200 microns.

In some embodiments, the method further comprises removing the first substrate from the second substrate by removing the layer of temporary adhesive material. According to another embodiment, the method further comprises forming at least one via opening in the layer of dielectric material before forming the at least one seal ring. According to another embodiment, the method further comprises depositing a layer of polymer material on at least a portion of the layer of dielectric material. According to another embodiment, the method further comprises forming at least one via opening in the layer of polymer material. According to another embodiment, the method further comprises forming at least one conductive pad, including portions disposed in the at least one via opening of the layer of polymer material. According to another embodiment, the method further comprises depositing solder material onto the at least one conductive pad and reflowing the solder material. According to another embodiment, the method further comprises depositing a metal seed layer including portions disposed in the at least one via opening of the layer of polymer material. According to some embodiments, the method further comprises mounting the packaged electronic device in electronic device modules. In some embodiments, the method further comprises mounting the electronic device modules in electronic devices.

In some embodiments, the method further comprises reusing the first substrate for forming multiple packaged electronic devices.

In accordance with another aspect of the present invention, a recyclable carrier substrate for use in forming a packaged electronic device is provided. According to at least one embodiment, the recyclable carrier substrate comprises a substrate having a coefficient of thermal expansion that is substantially the same as a coefficient of thermal expansion of a substrate of the electronic device used in forming the packaged electronic device, a layer of temporary adhesive material disposed on at least a portion of a surface of the substrate, a layer of dielectric material disposed on at least a portion of the layer of temporary adhesive material, and at least one seal ring formed on at least a portion of the layer of dielectric material.

In some embodiments, the at least one seal ring is further formed on at least a portion of the temporary adhesive material. According to some embodiments, the at least one seal ring is formed on portions of the temporary adhesive material through one or more openings formed in the layer of dielectric material.

In some embodiments, the at least one seal ring comprises an inner seal ring and an outer seal ring. According to some embodiments, the inner seal ring includes a binary alloy of two metal materials having a first ratio, and the outer seal ring includes the binary alloy of two metal materials having a second ratio that is different than the first ratio.

In accordance with another aspect of the invention, a packaged electronic device is provided. According to at least one embodiment, the packaged electronic device comprises a substrate, at least one bonding structure disposed on a surface of the substrate, at least one seal ring formed on the at least one bonding structure, a layer of dielectric material disposed on at least a portion of the at least one seal ring, a layer of polymer material disposed on at least a portion of the dielectric layer and at least a portion of the at least one seal ring, at least one conductive via formed on at least a portion of the polymer material and extending through openings formed in the polymer material and the layer of dielectric material to the at least one seal ring, and at least one electronic device disposed on the substrate and within a cavity that is at least partially defined by the at least one seal ring.

In some embodiments, the thickness of the packaged electronic device is less than 250 microns.

In some embodiments, the substrate is sapphire, lithium tantalite, lithium niobate, zirconium dioxide, zinc oxide, or quartz.

In some embodiments, the cavity is further defined by a portion of the layer of dielectric material and the surface of the substrate.

In some embodiments, the packaged electronic device further comprises interdigital (IDT) electrodes of an acoustic wave filter disposed on a surface of the substrate within the cavity. According to some embodiments, the packaged electronic device is included in an electronic device module. According to another embodiment, the packaged electronic device is included in an RF device. According to another embodiment, the electronic device module is a radio frequency (RF) device module. According to another embodiment, the electronic device module is included in a duplexer.

In accordance with another aspect of the invention, a method for using a recyclable carrier substrate is provided. According to at least one embodiment, the method comprises depositing a layer of temporary adhesive material on at least a portion of a surface of a recyclable carrier substrate having a first coefficient of thermal expansion, depositing a layer of dielectric material on at least a portion of the layer of temporary adhesive material, forming at least one seal ring on at least a portion of the layer of dielectric material, aligning and bonding the at least seal ring to at least one bonding structure attached to a surface of a first device substrate having a second coefficient of thermal expansion that is substantially the same as the first coefficient of thermal expansion of the recyclable carrier substrate, and removing the recyclable carrier substrate by removing the layer of temporary adhesive material.

In some embodiments, the method further comprises repeating the depositing of the layer of temporary adhesive material, the depositing of the layer of dielectric material, and the forming of the at least one seal ring using the removed recyclable carrier substrate, and aligning and bonding the at least seal ring to at least one bonding structure attached to a surface of a second device substrate having a third coefficient of thermal expansion that is substantially the same as the first coefficient of thermal expansion of the removed recyclable carrier substrate. In some embodiments, the method further comprises thinning the first device substrate prior to removing the recyclable carrier substrate.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Aspects and embodiments are directed to a method of forming a packaged electronic device using a recyclable carrier substrate. The processes and devices disclosed herein are capable of providing a low cost structure, while still maintaining functional, mechanical, and hermetic requirements. According to various aspects, the carrier substrate, otherwise referred to herein as a carrier wafer, has substantially the same coefficient of thermal expansion (CTE) as the device substrate, otherwise referred to herein as a device wafer. This minimizes wafer bow, stress, and cracks that can occur during certain manufacturing processes, such as during wafer bonding processes. The carrier substrate is also reusable and therefore offers cost savings.

At least one embodiment is directed to a recyclable carrier substrate that may be used in a surface acoustic wafer (SAW) filter package manufacturing process. The carrier substrate may provide mechanical support to the fragile SAW filter substrate, during certain manufacturing steps, such as during processes in which the SAW filter substrate is thinned. According to some embodiments, this allows the total thickness of the finished SAW filter package to be less than 250 microns.

The aspects disclosed herein in accordance with the present invention are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
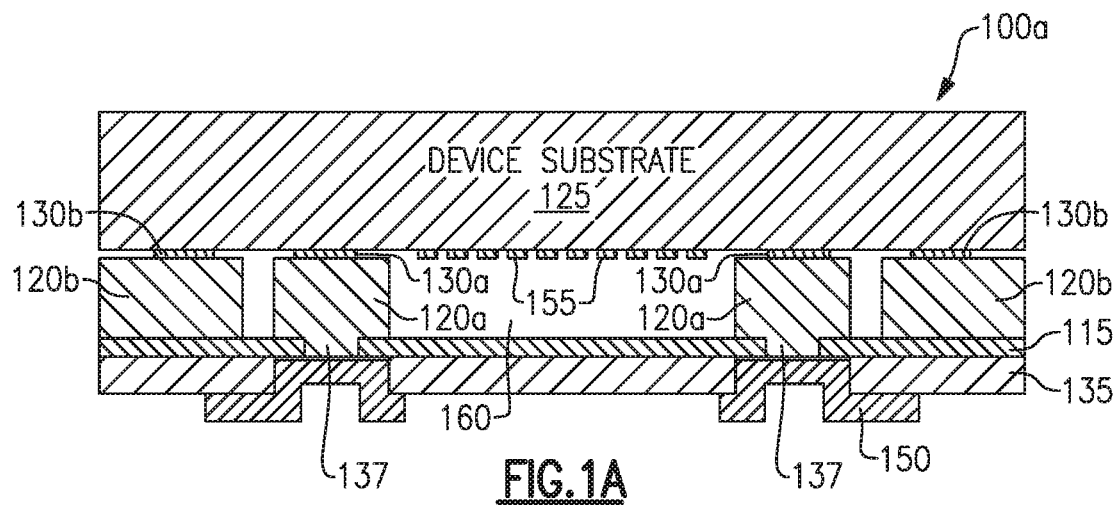
FIG. 1A is a cross-sectional side view of a first example of a packaged electronic device.

In accordance with various aspects, FIG. 1A illustrates a first example of a packaged electronic device, indicated generally at 100a. As used herein, the terms "electronic device" and "device" are used interchangeably and are to be understood to encompass semiconductor die, MEMS devices, and other electrical components that may be used according to one or more embodiments of the present invention. In certain instances, the electronic device may include or be part of a larger system, as discussed further below. Non-limiting examples of electronic devices include MEMS or acoustic wave devices, such as surface acoustic wafer (SAW) filters or bulk acoustic wave (BAW) filters, or other similar acoustic wave components. The electronic device includes a device substrate 125, and according to various embodiments, the device substrate 125 may be a material suitable for piezoelectric devices that are used as electronic components in cellular phones, such as SAW filters. Non-limiting examples of materials suitable for forming the device substrate 125 include piezoelectric single crystal materials, such as sapphire, lithium tantalite ($LiTaO_3$), lithium niobate ($LiNbO_3$), zirconium dioxide ($ZrO_2$), zinc oxide (ZiO), and quartz. It is to be appreciated that although the embodiments discussed herein reference a SAW filter device, aspects of the present invention may be applied to other types of electronic devices, including other types of acoustic wave devices. Interdigital transducer (IDT) electrodes 155 of a SAW filter may be provided on the device substrate 125 within a cavity 160 defined in the package 100a. As shown in FIG. 1A, the packaged SAW filter 100a may also include one or more bonding structures 130a and 130b, also referred to herein as electrodes, that are each attached to a respective seal ring 120a and 120b (discussed in further detail below) formed from sealing material, which in certain instances surrounds the cavity 160 to provide a hermetic seal. For example, in some embodiments the seal rings 120a and 120b (and thus the bonding structures 130a, 130b) fully circumscribe the cavity 160 and may be circular, square, rectangular, or any other desired shape suitable to hermetically seal the cavity 160. A layer of dielectric material 115 and a layer of polymer material 135 are further provided to seal the cavity 160. Metal contacts are also provided, which in this particular example includes a metal seed layer 150 comprising copper plating material.

Figure 1B:
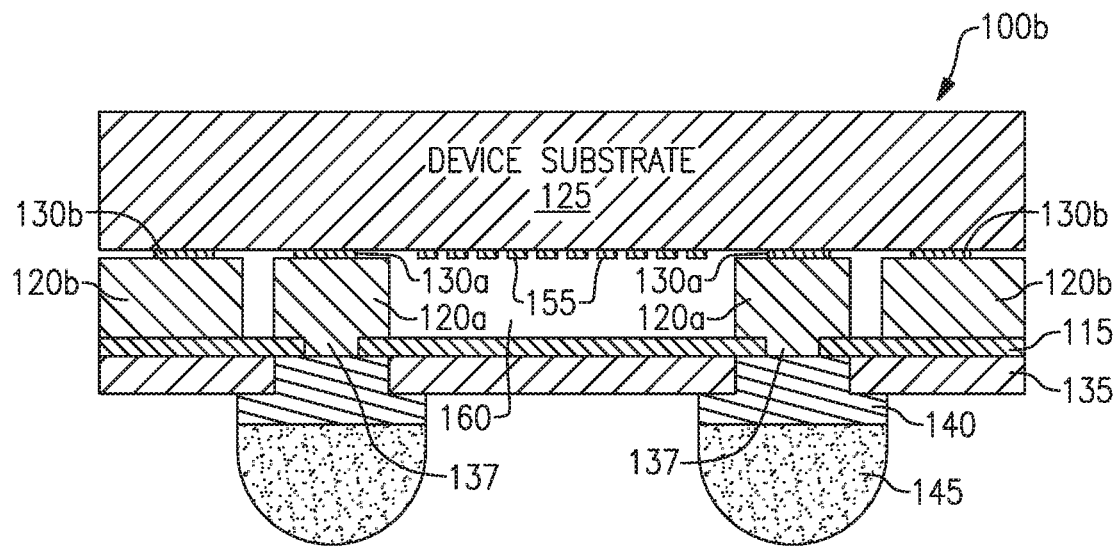
FIG. 1B is a cross-sectional side view of a second example of a packaged electronic device.

FIG. 1B illustrates a second example of a packaged electronic device, generally indicated at 100b. The packaged electronic device 100b may be a SAW filter, and as shown in FIG. 1B is similar in structure to the packaged SAW filter 100a of FIG. 1A, but features an alternative packaging option. According to this embodiment, the packaged SAW filter 100b includes contacts formed from pad material 140 (also referred to herein as a "conductive pad") and solder material 145 instead of the copper material 150 shown in FIG. 1A.

Figure 2A:
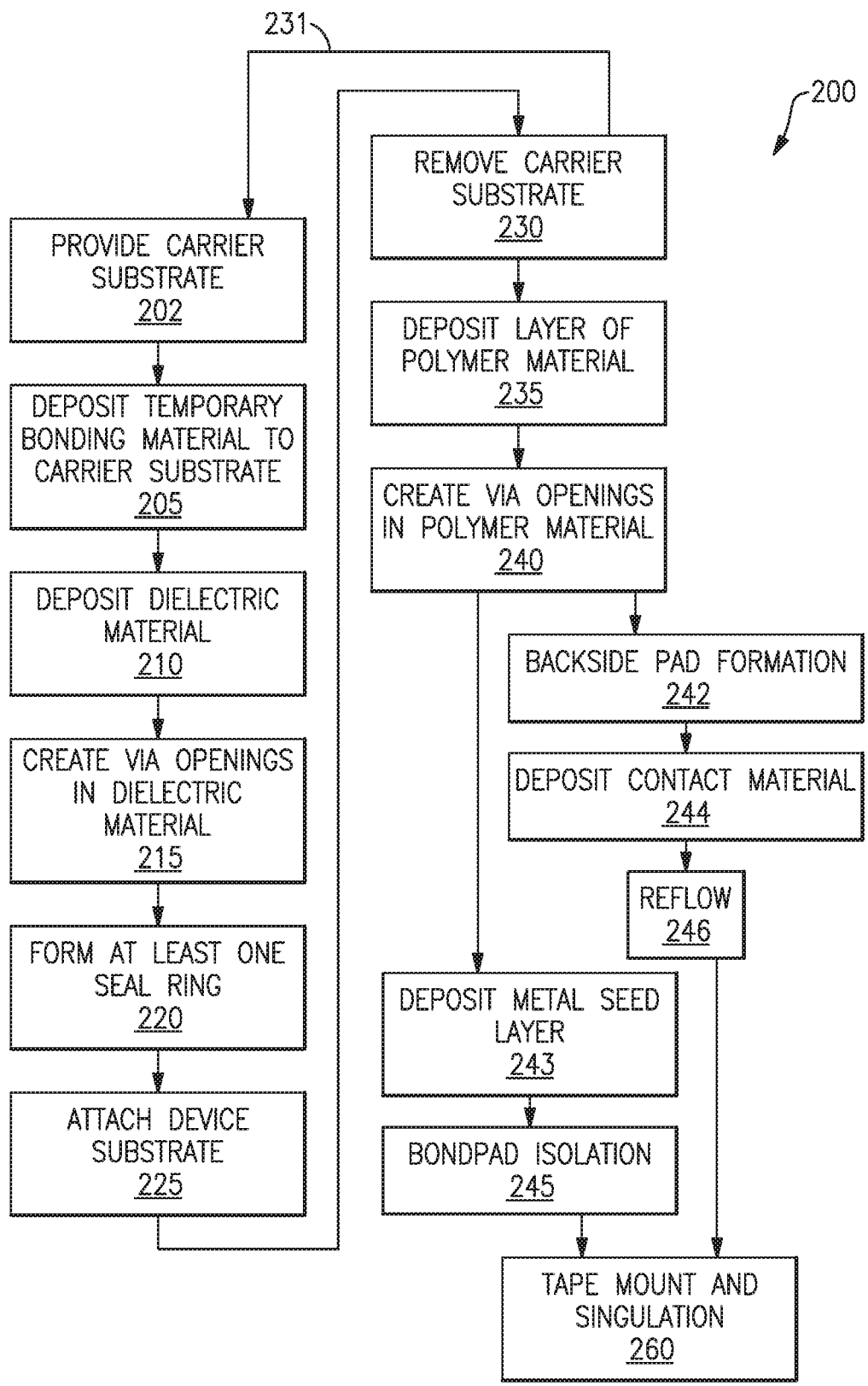
FIG. 2A is a flow chart illustrating an embodiment of a method of forming at least a portion of the electronic devices of FIGS. 1A and 1B.

According to certain aspects and embodiments, FIG. 2A illustrates a flow diagram of one example of a method 200 of forming at least a portion of the packaged electronic devices of FIGS. 1A and 1B. Process 200 will be described with reference to FIGS. 3A-3N. Although the discussion below references single devices formed in a single package, it is to be understood that the method may be applied to forming multiple devices on a common substrate or wafer. For example, step 260 includes singulation, where the substrate may be diced to individually separate the packaged electronic devices from one another.

Figure 3A:
FIG. 3A illustrates an act in the method of FIG. 2A.

A first step 202 includes providing a carrier substrate 105 (see FIG. 3A). According to at least one embodiment, the carrier substrate 105 has a coefficient of thermal expansion (CTE) that is substantially the same as that of the corresponding substrate of the device that is to be packaged. As used herein, the expression "substantially the same" when used in reference to the CTE of the carrier substrate and the corresponding device substrate means that the difference between the two CTE values is sufficiently small such that the device substrate and the carrier substrate expand and contract approximately the same amount when subjected to changes in temperature. According to various aspects, the carrier substrate is selected so as to achieve the lowest CTE mismatch possible. For example, sapphire (CTE of 6.95 ppm/° C.) may be paired with $Al_2O_3$ (CTE of 8 ppm/° C.), or with GaAs (CTE of 6.86 ppm/° C.), whereas pairing $LiTaO_3$ (CTE of 14 ppm/° C.) with either Si (2.6 ppm/° C.) or GaAs creates too large of a CTE mismatch. In accordance with certain aspects, having the CTE values be substantially the same allows the carrier substrate 105 and the device substrate 125 to expand and contract by approximately the same amount during one or more processing steps.

In certain instances, the carrier substrate 105 may be made from the same material as the substrate of the corresponding device. According to one embodiment, the carrier substrate 105 may be made of a piezoelectric single crystal such as, for example, sapphire, lithium tantalite, lithium niobate, quartz crystal, and the like. Other non-limiting examples of suitable carrier substrate 105 materials include zirconium dioxide ($ZrO_2$), zinc oxide (ZiO), and $Al_2O_3$. According to some embodiments, the device substrate 125 may be formed from gallium (Ga) based materials, such as gallium arsenide (GaAs). Further, in accordance with various aspects, the thickness of the carrier substrate 105 may be chosen such that the material forming the carrier substrate 105 doesn't experience mechanical failure, i.e., crack or break, during one or more processing steps. According to a further aspect, the thickness of the carrier substrate 105 may be chosen such that it provides additional mechanical support to the device substrate 125 during one or more processing steps. For instance, the device substrate 125 may bow in one direction during a processing step, and the carrier substrate 105 may bow in the same manner and thereby function to counteract or otherwise compliment the bowing of the device substrate 125. Listed below in Table 1 are CTE values for different types of materials used in semiconductor manufacturing. As stated above, according to some embodiments, the carrier substrate 105 may be made from the same material as the corresponding device substrate, but in alternative embodiments, the carrier substrate 105 may be made from a different material than the corresponding device substrate 125. For example, in certain instances the carrier substrate 105 may be sapphire, while the device substrate 125 may be gallium arsenide GaAs. Other suitable examples or materials that may be paired together include sapphire and $Al_2O_3$, Pyrex and $Si_3N_4$, Si and GaN, and AN and SiC.

TABLE 1

Thermal Expansion Coefficients at 20° C.

| Material | CTE (ppm/° C.) | Material | CTE (ppm/° C.) |
| --- | --- | --- | --- |
| Polymers | 55-200 | $Al_2O_3$ | 8 |
| Epoxy | 55 | Sapphire | 6.95 |
| E-glass | 54 | GaAs | 6.86 |
| Benzocyclobutene (BCB) | 42 | AlAs | 4.9 |
| Sn—Pb solder | 27 | InP | 4.75 |
| Copper | 16.7 | AlN | 4.6 |
| $LiNbO_3$ | 15.4 | SiC | 4.5 |
| Au—Sn solder | 14.7 | Pyrex | 3.2 |
| $LiTaO_3$ | 14 | $Si_3N_4$ | 3.2 |
| Gold | 14 | GaN | 2.8 |
| $ZrO_2$ | 10 | Si | 2.6 |

Figure 3B:
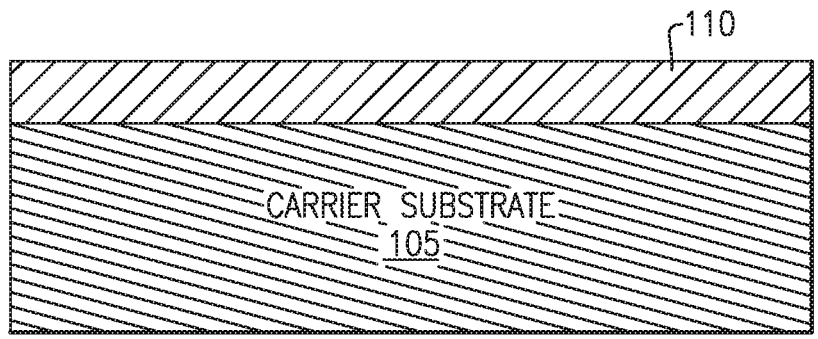
FIG. 3B illustrates an act in the method of FIG. 2A.

In step 205, and as illustrated in FIG. 3B, a layer of temporary adhesive material 110 may be deposited on at least a portion of a surface of the carrier substrate 105. According to some embodiments, the temporary adhesive material 110 is an adhesive material such as WaferBOND® HT-10.10 temporary bonding material available from Brewer Science, Inc., Rolla, Mo. or any other temporary wafer bonding material known in the art. According to various aspects, the layer of temporary adhesive material may have a thickness, for example, of between about 5 microns and about 20 microns. According to some embodiments, the layer of temporary adhesive material 110 may be deposited using a spin coating process, although other deposition techniques are also within the scope of this disclosure, such as screen printing. In some embodiments, the adhesive material 110 is a high temperature temporary bonding material, meaning that it can withstand processing steps that stay below a certain target temperature. For instance, according to some embodiments, the temporary adhesive material 110 may be used in process steps that do not exceed 220° C.

Figure 3C:
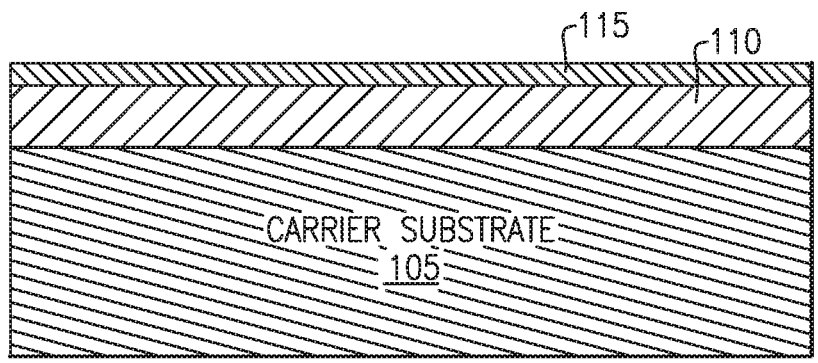
FIG. 3C illustrates an act in the method of FIG. 2A.

In step 210, and as illustrated in FIG. 3C, a layer of dielectric material 115 may be deposited on at least a portion of the layer of temporary adhesive material 110. Non-limiting examples of dielectric material 115 include insulation materials such as silicon oxide ($SiO_x$), silicon nitride ($Si_3N_4$), and the like. According to some embodiments, the layer of dielectric material 115 may be deposited using a low temperature processing method, such as a spin coating or physical vapor deposition (PVD) processes. For example, according to one embodiment, the layer of dielectric material 115 is deposited using a deposition method conducted at temperatures that are below about 300° C.

Figure 3D:
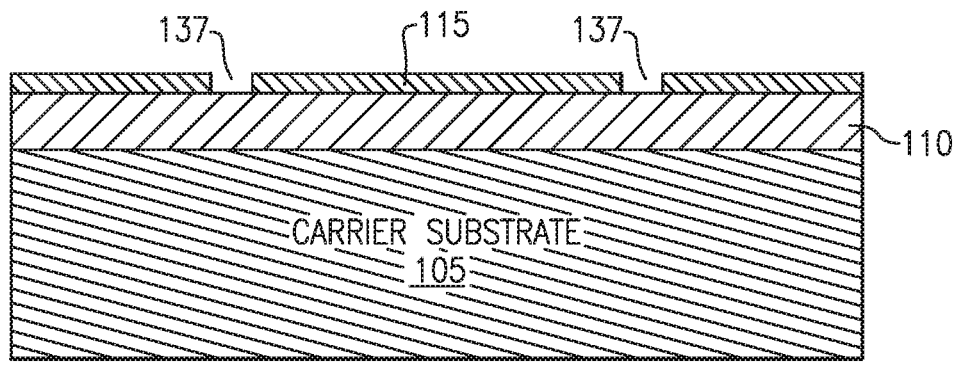
FIG. 3D illustrates an act in the method of FIG. 2A.

In step 215, a via opening 137 may be formed in the layer of dielectric material 115 (FIG. 3D). As discussed in further detail below, the via opening 137 may be used to allow for electric current to pass through to the electronic devices disposed on the device substrate 125, as shown in FIGS. 1A and 1B. Via opening 137 formed in the layer of dielectric material 115 may be formed using an etch process, such as a wet etch technique or a dry etch technique.

Figure 3E:
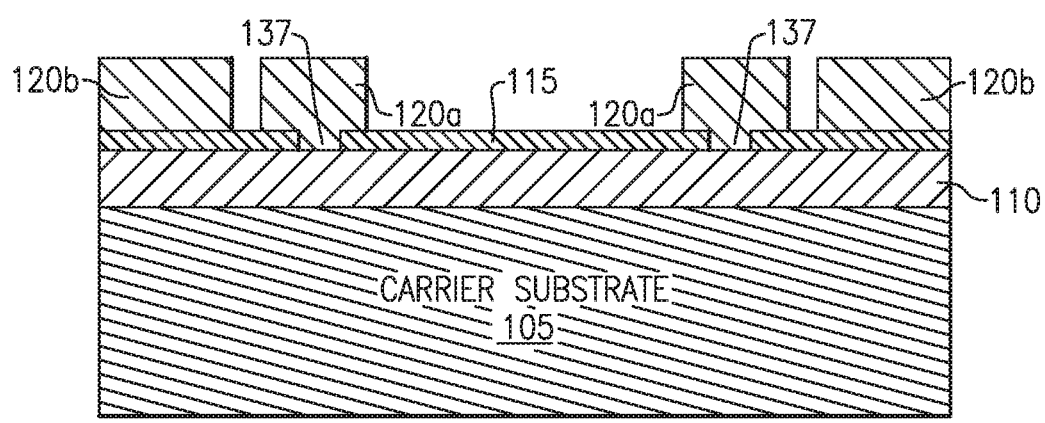
FIG. 3E illustrates an act in the method of FIG. 2A.

As shown in FIGS. 3E-3N, an inner seal ring 120a and an outer seal ring 120b are each formed from a layer of sealing material that is deposited on at least a portion of the layer of dielectric material 115 in step 220 (FIG. 3E). In accordance with various aspects, the inner and outer seal rings 120a and 120b function to hermetically seal the cavity 160 disposed within the cavity of the packaged electronic device. According to a further aspect, the inner seal ring 120a may form the "walls" of the cavity 160, as shown in FIGS. 1A and 1B. According to the embodiment shown in FIGS. 3E-3N, the outer seal ring 120b circumscribes both the cavity and the inner seal ring 120a (i.e., thereby providing a "nesting" effect) to protect the electronic devices disposed in the cavity (such as the IDT electrodes shown in FIGS. 1A and 1B) from external environmental effects by providing a hermetic seal. The inner seal ring 120a may thus circumscribe the cavity and provide the electrical contact to the electronic devices disposed in the cavity as well as provide a hermetic seal. Thus, according to some embodiments the inner seal ring 120a may also be deposited on at least a portion of the temporary adhesive material 110 through the via opening 137 etched in the layer of dielectric material 115, as shown in FIG. 3E. It is to be appreciated that although FIGS. 3E-3N illustrate two separate seal ring structures 120a and 120b, other configurations using multiple seal rings are also within the scope of this disclosure, such as three or four seal ring structures.

According to some embodiments, one or both of the inner and outer seal rings 120a and 120b may comprise gold. In accordance with some embodiments, the inner and outer seal rings 120a and 120b may comprise multiple materials and/or multiple layers of materials. For example, seal rings 120a and 120b may comprise a layer of gold and a layer of indium (In). In accordance with at least one embodiment, the inner and outer seal rings 120a and 120b may each comprise a transient liquid phase (TLP) bonding structure such as those described in commonly owned co-pending U.S. Provisional Application Ser. No. 62/264,422 titled "IMPROVED SEAL RING," filed Dec. 9, 2015, which is incorporated herein by reference in its entirety. For example, two metals having different melting points that are also capable of forming a binary alloy, such as such as gold and indium, may each be deposited in different ratios, such that the ratio of gold to indium in the inner seal ring 120a may be different than the ratio of gold to indium in the outer seal ring 120b. According to other embodiments, the inner seal ring 120a is gold, and the outer seal ring 120b comprises gold and indium. The sealing material(s) used to form inner and outer seal rings 120a and 120b may be deposited using any one or more techniques, such as e-beam evaporation or plating methods. According to some embodiments, the inner and outer seal rings 120a and 120b may have a thickness, for example, between about 5 microns and about 20 microns.

Figure 3F:
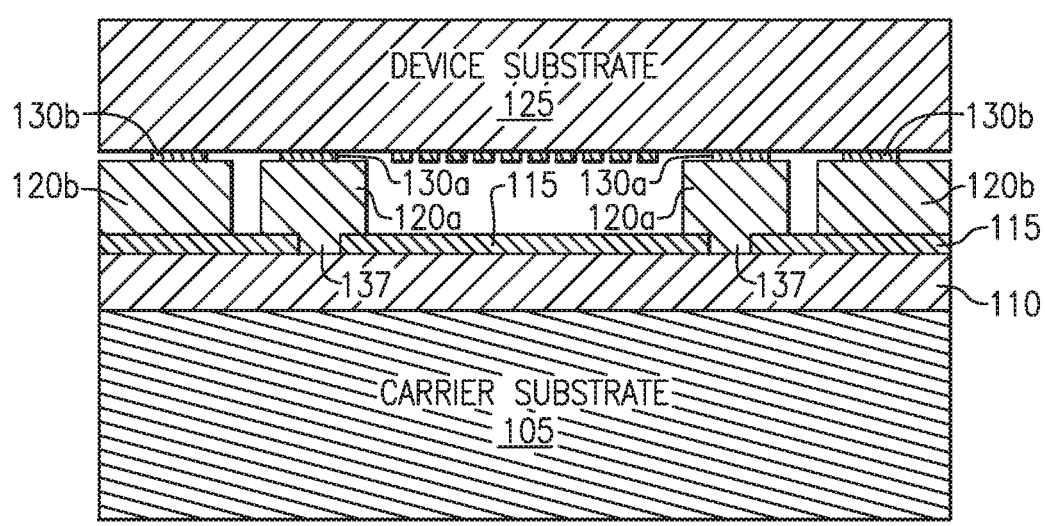
FIG. 3F illustrates an act in the method of FIG. 2A.

In step 225, and as illustrated in FIG. 3F, the device substrate 125 is attached to the carrier substrate 105. According to various aspects, bonding structures 130a and 130b, disposed on the device substrate 125 are aligned and attached to the corresponding seal rings 120a and 120b disposed on the carrier substrate 105. In some embodiments, the bonding structures 130a and 130b comprise metal material. For instance, the bonding structures 130a and 130b may comprise gold (Au) and/or indium (In), and/or a composite eutectic mixture of other suitable metals. In some embodiments, the device substrate is attached to the carrier substrate using an AuIn eutectic bonding technique performed at low process temperatures (e.g., ~190° C.). For example, indium may be evaporated onto gold contacts (thereby forming the bonding structures 130a and 130b) using an e-beam evaporation device. The structures forming seal rings 120a and 120b may each comprise gold and indium (in different ratios) that are aligned with the corresponding bonding structures (such that 130a aligns with 120a and 130b aligns with 120b) and subjected to a heat treatment, thereby forming a eutectic bond. Thus, according to certain aspects, the low melting point of indium allows for a low temperature eutectic bonding process for joining the device substrate and the carrier substrate and forming a hermetic seal.

Figure 3G:
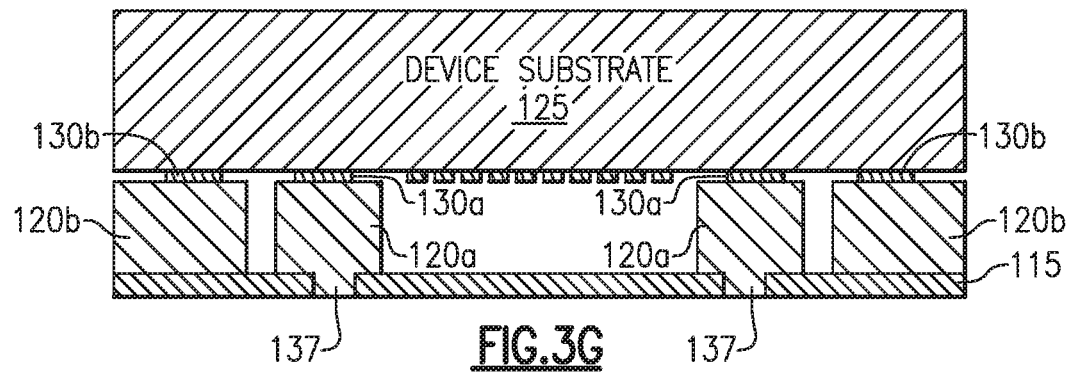
FIG. 3G illustrates an act in the method of FIG. 2A.

In step 230, the carrier substrate 105 may be removed from the device substrate 125 by removing the temporary adhesive material 110, as illustrated in FIG. 3G. For example, the temporary adhesive material 110 may be thermally decomposed or dissolved in a solvent to allow for the carrier substrate 105 to be removed and for the packages 100a and 100b shown in FIGS. 1A and 1B to be further processed and/or completed. Once removed, the carrier substrate 105 may be reused in another packaging process, as indicated at 231 in FIG. 2A. In certain instances, the carrier substrate 105 may undergo further processing, such as cleaning etc., before being used again in a separate packaging process. According to some embodiments, the carrier substrate 105 may be reused multiple times for forming multiple packaged devices.

Figure 3H:
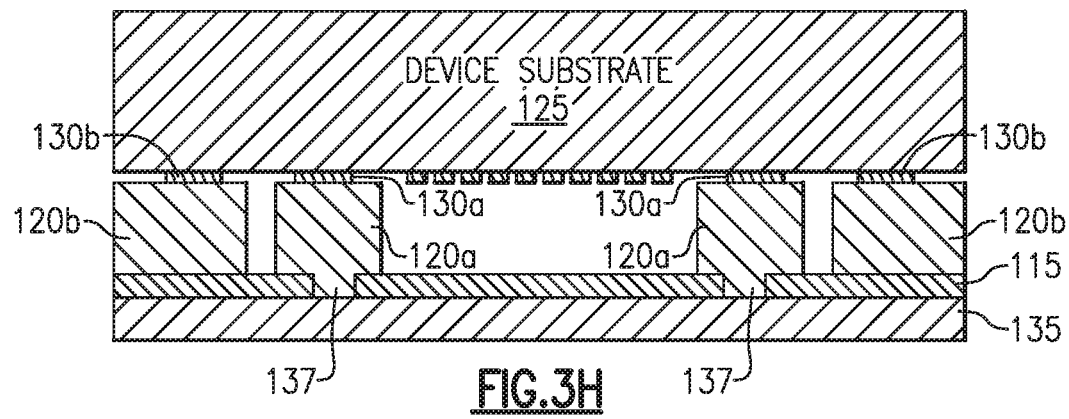
FIG. 3H illustrates an act in the method of FIG. 2A.

Once the layer of temporary adhesive material 110 has been removed, a layer of polymer material 135 may be deposited on at least a portion of the layer of dielectric material 115 in step 235 (FIG. 3H). According to various aspects, the layer of polymer material 135 may also be disposed on at least a portion of the seal rings 120a and 120b, such as the inner seal ring 120a, through the via 137 formed in the layer of dielectric material in step 215, as shown in FIG. 3H. Step 235 may also include curing the layer of polymer material 135 through a heating process. In accordance with at least one embodiment, the layer of polymer material 135 may provide mechanical stability for the packaged device. The polymer material 135 may comprise one or more polymers, non-limiting examples of which include epoxy materials, including photoresist materials such as SU-8, polyimide, and other organic materials, such as benzocyclobutene (BCB), etc. The layer of polymer material 135 may be deposited using any one of a number of different processes, such as spin coating and chemical vapor deposition (CVD) techniques.

Figure 3I:
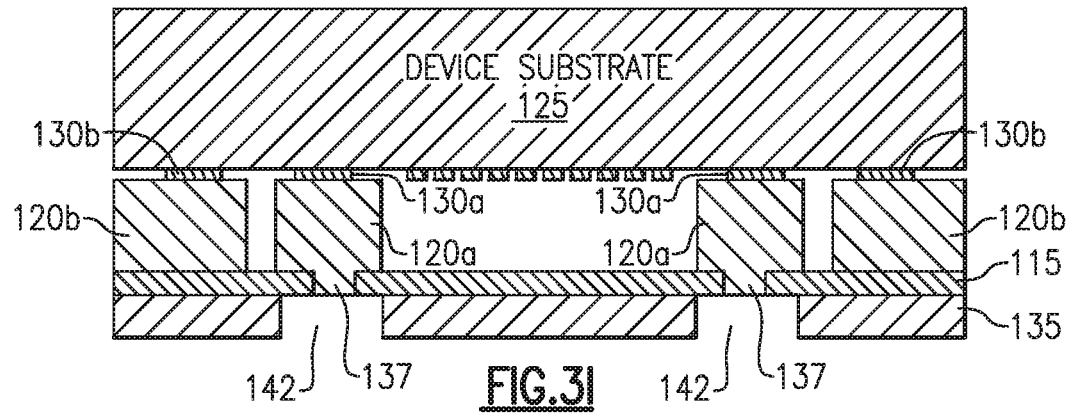
FIG. 3I illustrates an act in the method of FIG. 2A.

In step 240, and as shown in FIG. 3I, a via opening 142 may be formed in the layer of polymer material 135 using wet etch or dry etch processes. According to various aspects, conductive material and/or conductive structures may be formed within via opening 142 to allow for electrical current to pass through to the electronic devices disposed on the device substrate 125. For example, via opening 142 formed in the layer of polymer material 135 may also align with the via opening 137 formed in the layer of dielectric material 115, so that conductive material can be deposited into the opening for the purposes of forming an electric contact with the inner seal ring 120a (and the electronic devices disposed on the device substrate).

Figure 3J:
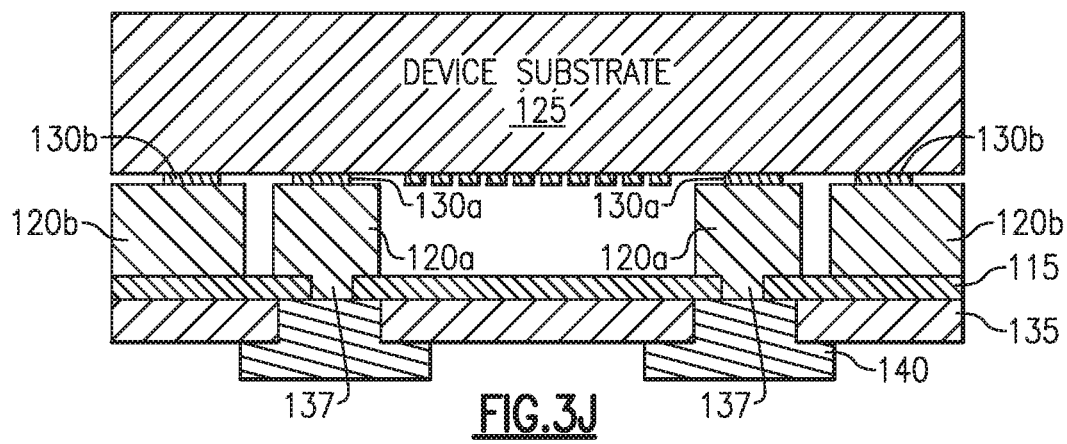
FIG. 3J illustrates an act in the method of FIG. 2A.
Figure 3K:
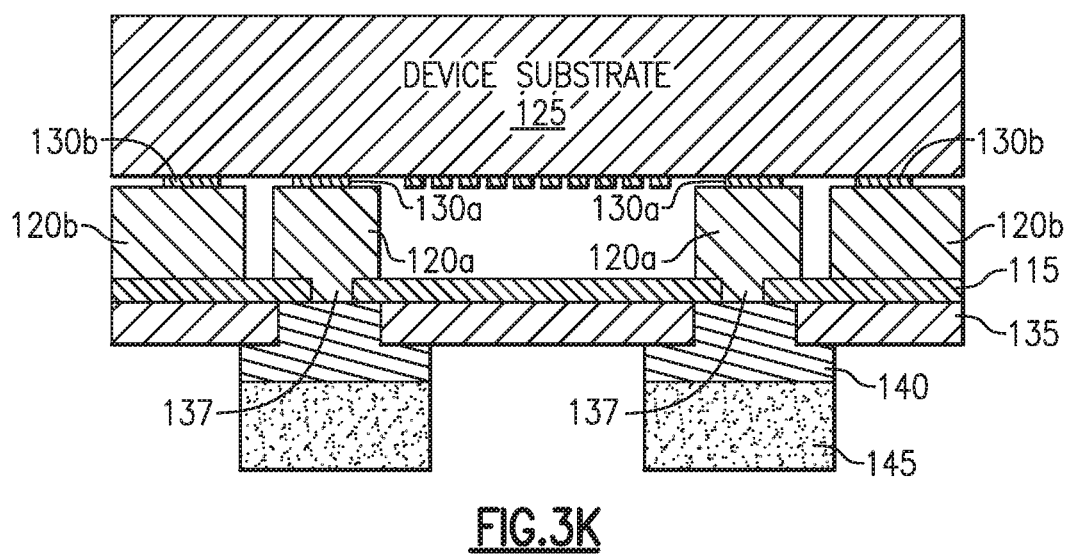
FIG. 3K illustrates an act in the method of FIG. 2A.
Figure 3L:
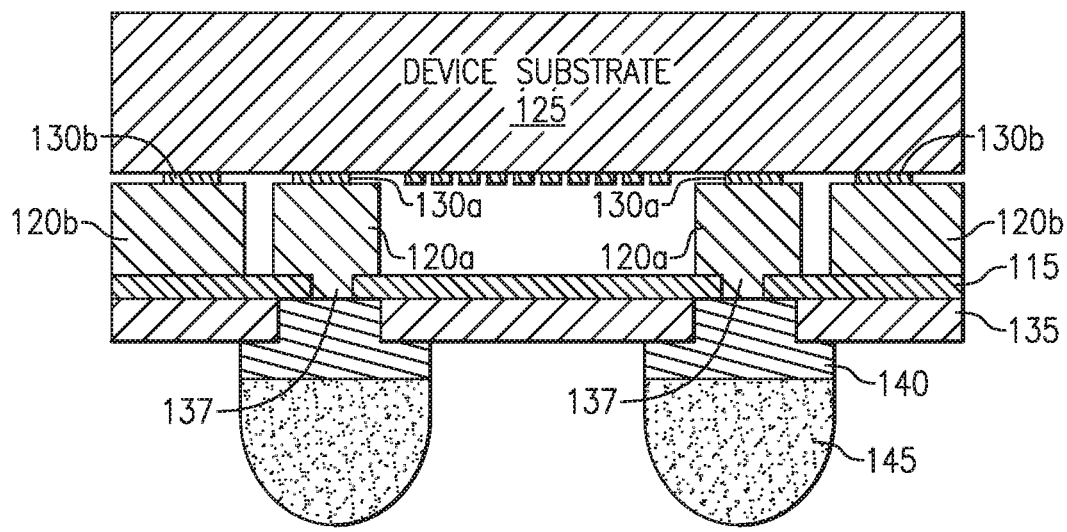
FIG. 3L illustrates an act in the method of FIG. 2A.

Steps 242, 244, and 246 of FIG. 2A are associated with FIGS. 3J-3L, and represent one option for packaging an electronic device in accordance with one embodiment. For example, in step 242 (FIG. 3J) a pad 140 formed from conductive material may be formed within via opening 142 of the polymer material 135, and as shown in FIG. 3J, may also be formed on at least a portion of an outer surface of the polymer material 135. The material forming the pad 140 may extend through the entire depth of the polymer material 135, and also contact at least a portion of the outer surface of the dielectric material 115 and an outer surface of the portion of the inner seal ring 120a surrounding the cavity 160. According to various aspects, the pad 140 may be a bond pad, as readily understood by those of skill in the art. The pad 140 may be formed using typical lithography techniques, for example by depositing a layer of metal, such as copper, onto the polymer layer 135 and then coating the metal with a thick layer of photoresist, which is then exposed and developed to protect the areas that form the final pad structure. An etch process, such as a wet etch process, may then remove the metal outside the desired areas that form the pad 140. Once the pad 140 has been formed, solder material 145 may be deposited in step 244 (FIG. 3K) onto the surface of the pad, and in step 246 solder reflow is performed to melt the solder bumps (FIG. 3L).

Figure 3M:
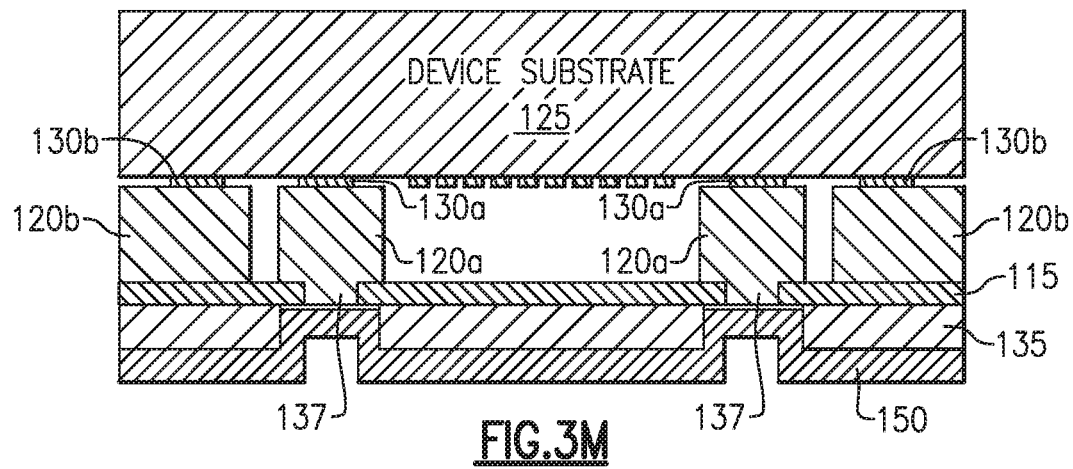
FIG. 3M illustrates an act in the method of FIG. 2A.
Figure 3N:
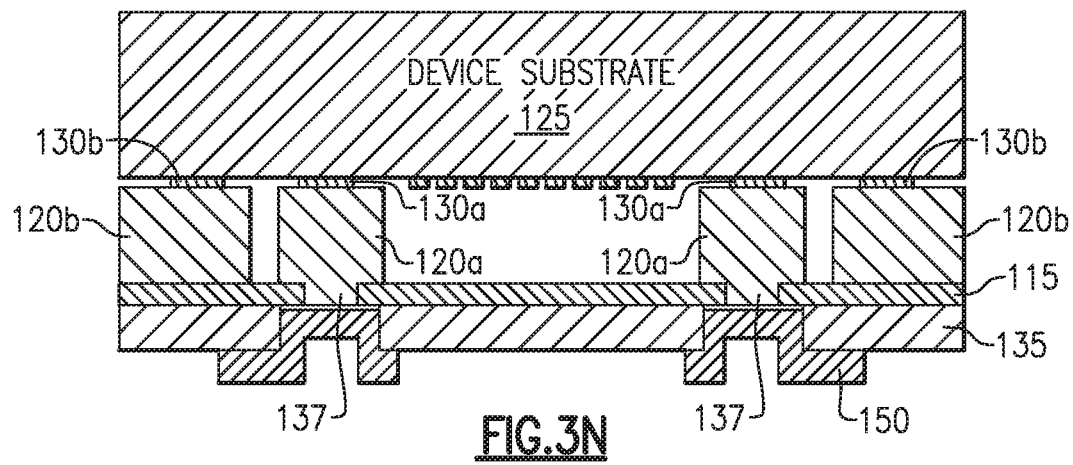
FIG. 3N illustrates an act in the method of FIG. 2A.

Steps 243 and 245 of FIG. 2A are associated with FIGS. 3M and 3N and represent another option for packaging the electronic device in accordance with another embodiment. For example, in step 243, a metal seed layer 150 is deposited on at least a portion of the outer surface of the layer of polymer material 135 and within the via opening 142 formed within the polymer material 135 (FIG. 3M). As shown in FIG. 3M, the metal seed layer 150 may also be formed on at least a portion of the outer surface of both the dielectric layer 115 and the inner seal ring 120a. The metal seed layer 150 may be deposited using PVD methods, such as sputtering or evaporative techniques. According to at least one embodiment, the metal seed layer 150 may comprise copper (Cu) or gold (Au), which are deposited as a seed layer using a sputter technique. According to some embodiments, a barrier layer of titanium tungsten (TiW), nickel vanadium (NiV), or titanium (Ti) may be used to protect diffusion of the metal seed layer 150 into one or more underlying layers. For instance, a layer of TiW may be deposited on the polymer layer 135 and within via opening 142 prior to depositing the metal seed layer 150. In step 245, portions of the metal seed layer 150 are removed (FIG. 3N) to form bond pads that allow for electrical contact between elements of the package, (e.g., electrodes) and the outside of the package. The metal seed layer 150 may be removed using an etch method, such as a wet etch processing technique using peroxide, potassium iodide (KI), or acid based solutions, as recognized by those skilled in the art.

Referring back to FIG. 3L, a conductive via or path is thus formed between the reflowed solder material 145 through the conductive pad 140 and through vias 142 and 137 formed in the polymer material 135 and dielectric material 115 respectively, to the inner seal ring 120a and finally to the bonding structure 130a disposed on the device substrate 125. Likewise, referring to FIG. 3N, a similar conductive via or path is formed between the metal seed layer 150 through the inner seal ring 120a to the bonding structure 130a. This allows for electrical contact between elements of the package, such as IDT electrodes 155 of FIGS. 1A and 1B, and the outside of the package.

In step 260, the packaged devices are mounted to an adhesive-coated tape and singulated using a die cutting process. For example, an outer portion of the device substrate 125 (opposite the cavity 160 where no components are fabricated) may be attached to the adhesive-coated tape and cut to the size of the individual packages.

Figure 2B:
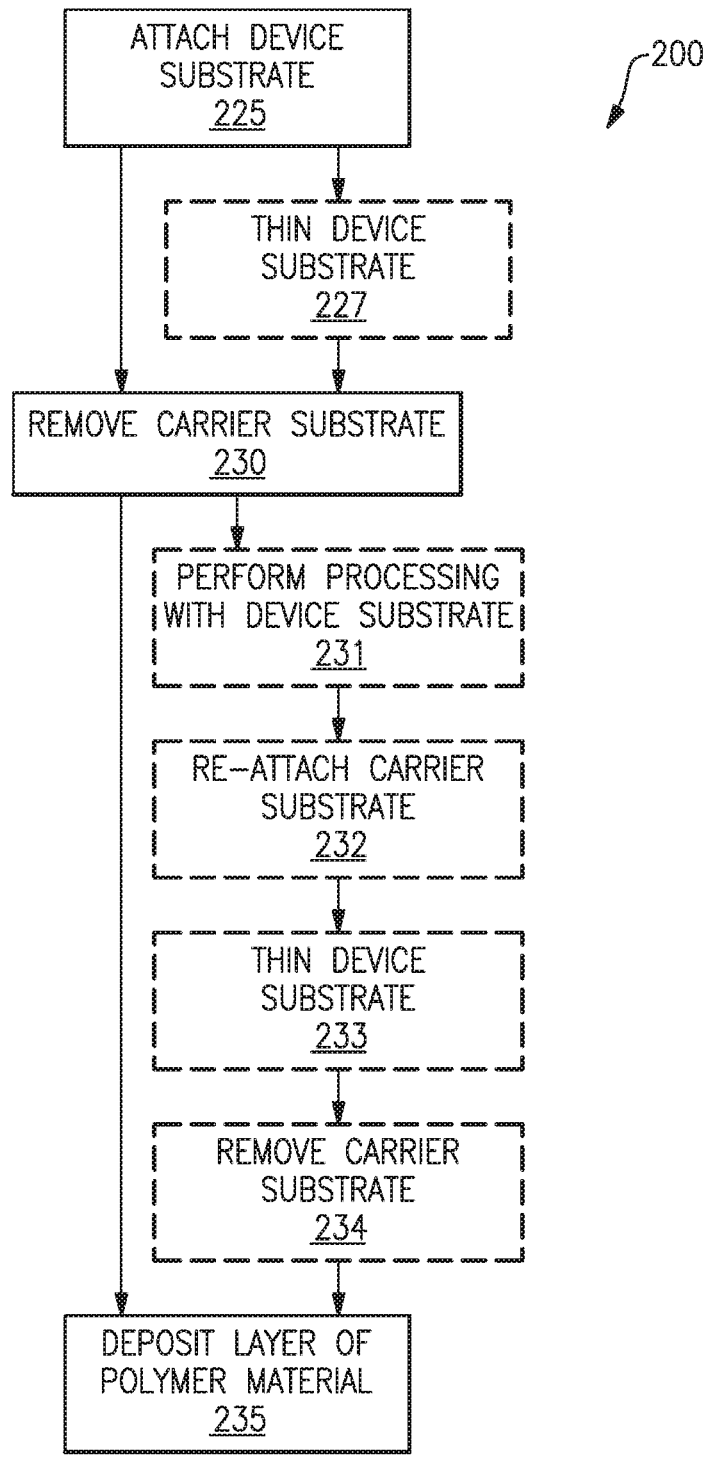
FIG. 2B is a flow chart illustrating alternative embodiments of the method of FIG. 2A.

FIG. 2B is a flow chart illustrating alternative embodiments of the method described previously in FIG. 2A. For example, according to one embodiment, after the device substrate 125 is attached to the carrier substrate 105 in act 225, the device substrate 125 may be thinned (step 227). For example, a SAW filter device substrate can be thinned from a starting thickness of greater than 250 microns to a thickness in a range of about 150 to about 200 microns. Having the carrier substrate attached to the device structure improves the mechanical stability of the device substrate, which can be very fragile and susceptible to damage during the thinning process. In certain instances, this allows the entire thickness of the finished packaged device to be less than 250 microns. In accordance with one embodiment, the device substrate may be thinned after attaching it to the carrier substrate (step 227), after which the carrier substrate 105 may be removed (step 230) as discussed above. According to other embodiments, the carrier substrate is first removed (step 230) and the device substrate may be further processed (step 231). For example, the device substrate may undergo additional thermal processing while the carrier substrate is removed. The carrier substrate may be re-attached (step 232) and the device substrate may be thinned (step 233). According to some embodiments, a different carrier substrate material may be used in the re-attachment process at step 232 than was used in steps 205-220. For example, a GaAs carrier substrate may be used for steps 205-230, and then a sapphire carrier substrate may be attached at step 232 and used during the device substrate thinning process of step 233. Similar examples using other materials are also within the scope of this disclosure.

The processes depicted in FIGS. 2A and 2B include examples of particular sequences of acts according to particular embodiments. The acts included in these processes may be performed by, or using, one or more semiconductor manufacturing devices as will be understood by those skilled in the art. Some acts may be optional and, as such, may be omitted in accord with one or more embodiments. Additionally, the order of acts can be altered, or other acts can be added, without departing from the scope of the embodiments described herein.

In accordance with one or more embodiments, the packaged electronic device illustrated in FIGS. 1A and 1B may be an acoustic wave device, such as a SAW filter. It will be appreciated by those skilled in the art, given the benefit of this disclosure, that components or devices, such as an acoustic wave filter, an antenna duplexer, a module, or a communications device, for example, may be configured to use embodiments of the packaging process according to this disclosure, and that such components or devices may have enhanced or improved features through the benefits provided by the packaging process.

Figure 4:
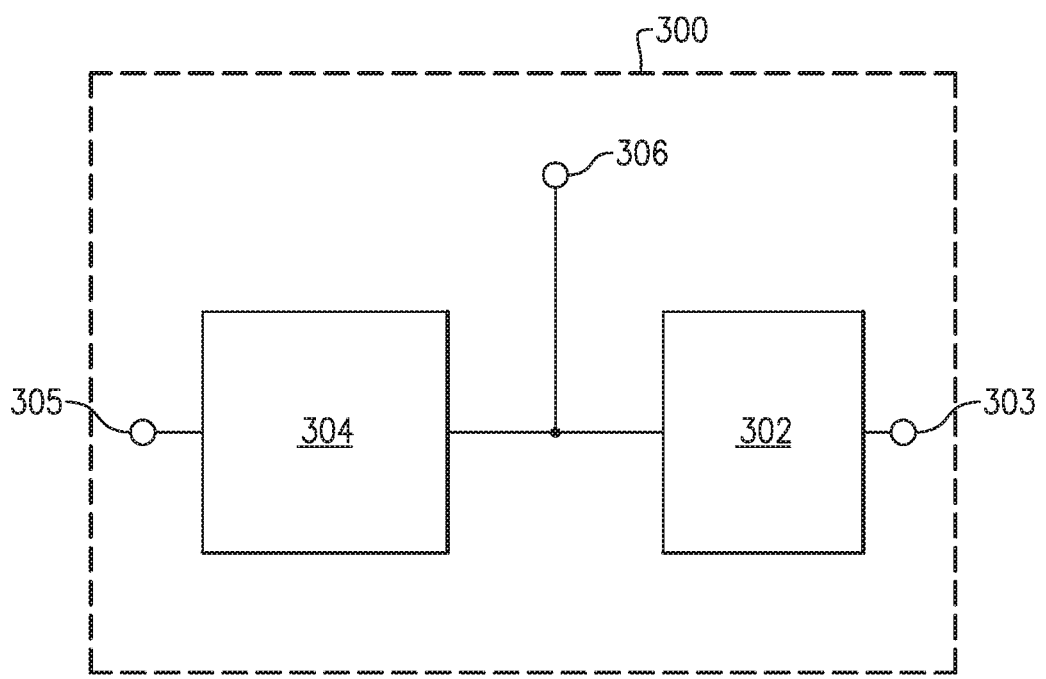
FIG. 4 is a block diagram of one example of an antenna duplexer incorporating a packaged electronic device according to aspects of the present invention.

According to one embodiment, a packaged electronic device including an acoustic wave device may be used to provide an antenna duplexer having improved characteristics. FIG. 4 illustrates a block diagram of one example of an antenna duplexer which can incorporate embodiments of the packaged electronic device disclosed herein. The antenna duplexer 300 includes a transmission filter 302 and a reception filter 304 that are connected to a shared antenna terminal 306. The transmission filter 302 includes a transmit terminal 303 for connecting the transmission filter to transmitter circuitry (not shown), and the reception filter includes a reception terminal 305 for connecting the reception filter to receiver circuitry (not shown). Either or both of the transmission filter 302 and the reception filter 304 can include one or more of the packaged electronic devices, such as the acoustic wave devices as disclosed herein. By configuring the antenna duplexer 300 to use the packaged acoustic wave devices, an antenna duplexer having improved characteristics and enhanced performance (resulting from the improved characteristics of the packaged acoustic wave devices discussed above such as the reduced thickness of the package) can be realized.

Figure 5:
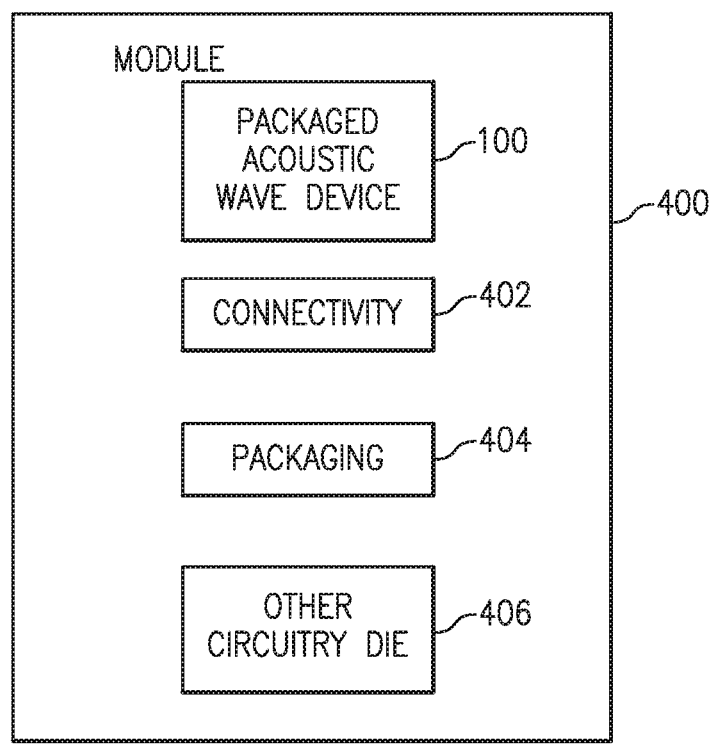
FIG. 5 is a block diagram of one example of a module incorporating a packaged electronic device according to aspects of the present invention.

Further, embodiments of the packaged acoustic wave devices may be incorporated, optionally as part of the antenna duplexer 300, into a module that may ultimately be used in a device, such as a wireless communications device, for example, so as to provide a module having enhanced performance. FIG. 5 is a block diagram illustrating one example of a module 400 including an embodiment of a packaged acoustic wave device 100. The module 400 further includes connectivity 402 to provide signal interconnections, packaging 404, such as for example, a package substrate, for packaging of the circuitry, and other circuitry die 406, such as, for example amplifiers, pre-filters, modulators, demodulators, down converters, and the like, as would be known to one of skill in the art of semiconductor fabrication in view of the disclosure herein. In certain embodiments, the packaged acoustic wave device 100 in module 400 may be replaced with the antenna duplexer 300, so as to provide an RF module, for example.

Figure 6:
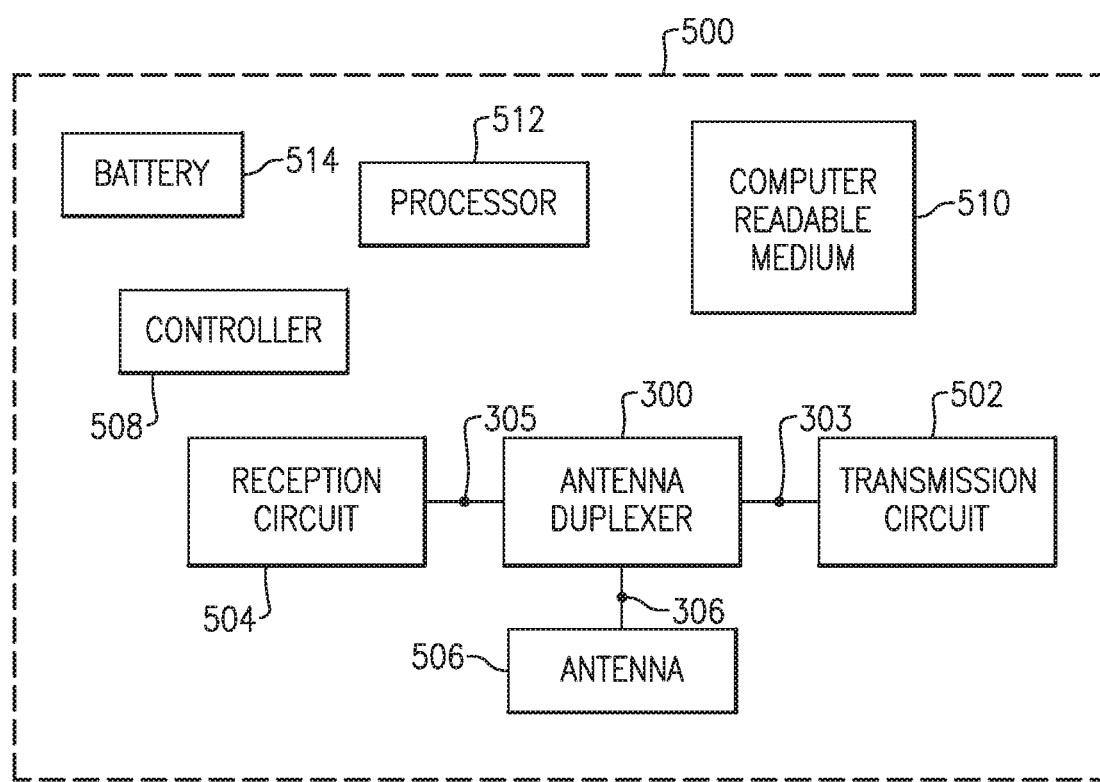
FIG. 6 is a block diagram of one example of a communications device incorporating the antenna duplexer of FIG. 4, according to aspects of the present invention.

Furthermore, configuring an acoustic wave filter and/or antenna duplexer to use embodiments of the packaged acoustic wave device can achieve the effect of realizing a communication device having enhanced performance using the same. FIG. 6 is a schematic block diagram of one example of a communication device 500 (e.g., a wireless or mobile device) that can include the antenna duplexer 300 incorporating one or more packaged acoustic wave devices, as discussed above. The communication device 500 can represent a multi-band and/or multi-mode device such as a multi-band/multi-mode mobile phone, for example. In certain embodiments, the communication device 500 can include the antenna duplexer 300, a transmission circuit 502 connected to the antenna duplexer via the transmit terminal 303, a reception or receive circuit 504 connected to the antenna duplexer 300 via the reception terminal 305, and an antenna 506 connected to the antenna duplexer via the antenna terminal 306. The transmission circuit 502 and reception circuit 504 may be part of a transceiver that can generate RF signals for transmission via the antenna 506 and can receive incoming RF signals from the antenna 506. The communication device 500 can further include a controller 508, a computer readable medium 510, a processor 512, and a battery 514.

It will be understood that various functionalities associated with the transmission and receiving of RF signals can be achieved by one or more components that are represented in FIG. 6 as the transmission circuit 502 and the reception circuit 504. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 506. For example, a single antenna can be configured to provide both transmitting and receiving functionalities. In another example, transmitting and receiving functionalities can be provided by separate antennas. In yet another example in which the communication device is a multi-band device, different bands associated with the communication device 500 can be provided with different antennas.

To facilitate switching between receive and transmit paths, the antenna duplexer 300 can be configured to electrically connect the antenna 506 to a selected transmit or receive path. Thus, the antenna duplexer 300 can provide a number of switching functionalities associated with an operation of the communication device 500. In addition, as discussed above, the antenna duplexer 300 may include the transmission filter 302 and reception filter 304, which are configured to provide filtering of the RF signals. As discussed above, either or both of the transmission filter 302 and reception filter 304 can include embodiments of the packaged acoustic wave device, and thereby provide enhanced features and/or performance through the benefits of the ability to downsize and improved connection reliability achieved using embodiments of the packaged acoustic wave device. In certain examples, the antenna duplexer 300 in the communication device 500 can be replaced with a module 400, which includes the antenna duplexer, as discussed above.

As shown in FIG. 6, in certain embodiments, a controller 508 can be provided for controlling various functionalities associated with operations of the antenna duplexer 300 and/or other operating component(s). In certain embodiments, a processor 512 can be configured to facilitate implementation of various processes for operation of the communication device 500. The processes performed by the processor 512 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 500. In certain embodiments, these computer program instructions may also be stored in the computer-readable medium 510. The battery 514 can be any suitable battery for use in the communication device 500, including, for example, a lithium-ion battery.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A method of forming a packaged electronic device, the method comprising:
   forming an electronic device on a first substrate;
   depositing a layer of polymeric temporary adhesive material on at least a portion of an upper surface of a second substrate;
   depositing a layer of dielectric material directly on at least a portion of an upper surface of the layer of polymeric temporary adhesive material;
   forming an inner seal ring and an outer seal ring on the first substrate around the electronic device, the inner seal ring including a binary alloy of two metal materials having a first ratio, the outer seal ring including the binary alloy of two metal materials having a second ratio that is different than the first ratio, a first portion of a lower surface of the inner seal ring being formed directly on the layer of polymeric temporary adhesive material, a second portion of the lower surface of the inner seal ring being formed directly on the layer of dielectric material; and
   bonding the second substrate to the inner seal ring and to the outer seal ring.

2. The method of claim 1 further comprising removing the first substrate from the second substrate by removing the layer of temporary adhesive material.

3. The method of claim 2 further comprising reusing the first substrate for forming multiple packaged electronic devices.

4. The method of claim 1 further comprising forming at least one via opening in the layer of dielectric material before forming the inner seal ring and outer seal ring.

5. The method of claim 1 further comprising depositing a layer of polymer material on at least a portion of the layer of dielectric material.

6. The method of claim 5 further comprising forming at least one via opening in the layer of polymer material.

7. The method of claim 1 wherein forming the portions of the inner seal ring and outer seal ring includes forming the portions of the inner seal ring and outer seal ring through one or more openings formed in the layer of dielectric material.

8. The method of claim 1 wherein bonding the second substrate to the inner seal ring and to the outer seal ring comprises:
bonding a first bonding structure attached to a surface of the first substrate to the inner seal ring; and
bonding a second bonding structure attached to the surface of the first substrate to the outer seal ring.

9. The method of claim 4 wherein forming the at least one via opening in the layer of dielectric material includes exposing a surface of the polymeric temporary adhesive material.

10. A method of forming a packaged electronic device, the method comprising:
forming at least one seal ring of at least one metal material on a lower surface of a substrate, forming the at least one seal ring including forming an inner seal ring from a binary alloy of two metal materials having a first ratio and forming an outer seal ring from the binary alloy of two metal materials having a second ratio that is different than the first ratio;
depositing a layer of dielectric material on at least a portion of a lowest surface of the at least one seal ring, the lowest surface of the at least one seal ring being parallel to a plane defined by the lower surface of the substrate; and
disposing at least one electronic device on the substrate and within a cavity having walls that are defined by the at least one seal ring, a portion of the layer of dielectric material, and the lower surface of the substrate, the inner seal ring circumscribing the cavity and the outer seal ring circumscribing both the cavity and the inner seal ring.

11. The method of claim 10 wherein forming the at least one seal ring includes forming the at least one seal ring on a bonding structure formed on the lower surface of the substrate.

12. The method of claim 10 further comprising depositing a layer of polymer material on at least a portion of a lower surface of the layer of dielectric material.

13. The method of claim 12 further comprising forming at least one conductive via on at least a portion of a lower surface of the layer of polymer material and extending through openings formed in the layer of polymer material and the layer of dielectric material to the at least one seal ring.

14. The method of claim 13 wherein forming the at least one conductive via includes depositing a metal seed layer of copper or gold on the at least one seal ring.

15. The method of claim 13 wherein forming the at least one conductive via includes depositing a conductive pad of metal and a layer of solder material.

16. The method of claim 13 further comprising disposing the packaged electronic device in an electronic device module.

17. The method of claim 10 further comprising forming interdigital (IDT) electrodes of an acoustic wave filter on the lower surface of the substrate within the cavity.

18. The method of claim 10 further comprising forming an aperture in the layer of dielectric material that exposes a portion of the lowest surface of the at least one seal ring, the layer of dielectric material covering a second portion of the lowest surface of the at least one seal ring.

19. A method of forming a packaged electronic device, the method comprising:
forming at least one bonding structure on a lower surface of a substrate;
forming an inner seal ring and an outer seal ring on a lower surface of the at least one bonding structure, the inner seal ring including a binary alloy of two metal materials having a first ratio, the outer seal ring including the binary alloy of two metal materials having a second ratio that is different than the first ratio;
forming a layer of dielectric material on at least portions of lower surfaces of each of the inner seal ring and outer seal ring, the lowest surfaces of the of the inner seal ring and outer seal ring being parallel to a plane defined by the lower surface of the substrate;
forming a layer of polymer material on at least a portion of a lower surface of the layer of dielectric material;
forming at least one conductive via on at least a portion of a lower surface of the layer of polymer material and extending through openings formed in the layer of polymer material and the layer of dielectric material to at least one of the inner seal ring and outer seal ring; and
disposing at least one electronic device on the substrate and within a cavity having walls that are defined by the inner seal ring, the inner seal ring circumscribing the cavity and the outer seal ring circumscribing both the cavity and the inner seal ring.

20. The method of claim 19 wherein forming the inner seal ring includes forming the inner seal ring with a first portion of a lower surface of the inner seal ring disposed on the layer of dielectric material and a second portion of the lower surface of the inner seal ring disposed within an aperture defined in the layer of dielectric material.

21. The method of claim 20 wherein forming the inner seal ring includes forming the second portion of the lower surface of the inner seal ring on a layer of polymeric temporary adhesive material.

* * * * *

UNITED STATES PATENT AND TRADEMARK OFFICE
CERTIFICATE OF CORRECTION

PATENT NO. : 11,101,160 B2  
APPLICATION NO. : 16/845455  
DATED : August 24, 2021  
INVENTOR(S) : Jiro Yota et al.

Page 1 of 1

It is certified that error appears in the above-identified patent and that said Letters Patent is hereby corrected as shown below:

In the Specification

Column 7, Line 15, delete "AN" and insert -- A1N --.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*